*(12)* United States Patent
Ahirwar et al.

(10) Patent No.: US 10,341,053 B2
(45) Date of Patent: Jul. 2, 2019

(54) SYSTEMS AND METHODS FOR A LOG-LIKELIHOOD RATIO BASED DYNAMIC PRE-PROCESSING SELECTION SCHEME IN A LOW-DENSITY PARITY-CHECK DECODER

(71) Applicant: Marvell World Trade Ltd., St. Michael (BB)

(72) Inventors: Vijay Ahirwar, Madhya Pradesh (IN); Sri Varsha Rottela, Andhra Pradesh (IN)

(73) Assignee: Marvell World Trade Ltd., St. Michael (BB)

( * ) Notice: Subject to any disclaimer, the term of this patent is extended or adjusted under 35 U.S.C. 154(b) by 76 days.

(21) Appl. No.: 15/783,314

(22) Filed: Oct. 13, 2017

(65) Prior Publication Data

US 2018/0109354 A1 Apr. 19, 2018

Related U.S. Application Data

(60) Provisional application No. 62/408,408, filed on Oct. 14, 2016.

(51) Int. Cl.
*G11C 29/00* (2006.01)
*H04L 1/00* (2006.01)
(Continued)

(52) U.S. Cl.
CPC ....... *H04L 1/0045* (2013.01); *H03M 13/1102* (2013.01); *H03M 13/1111* (2013.01);
(Continued)

(58) Field of Classification Search
CPC ... H04L 1/0045; H04L 1/0058; H04L 1/0061; H04L 1/0051; H03M 13/1102;
(Continued)

(56) References Cited

U.S. PATENT DOCUMENTS 7,876,860 B1 1/2011 Varnica et al.
8,286,048 B1 * 10/2012 Chen ................. H03M 13/1128
714/752

(Continued)

FOREIGN PATENT DOCUMENTS

EP 2 204 984 7/2010

OTHER PUBLICATIONS

Linqi Song et al., "A Normalized LLR soft information demapping method in DTMB system," Proc. 11$^{th}$ IEEE Singapore International Conference on Communication Systems 2008, IEEE Piscataway, NJ, USA (Nov. 19, 2008) pp. 1297-1301 (2008).

*Primary Examiner* — Samir W Rizk

(57) ABSTRACT

Embodiments described herein provide a system for dynamically selecting a pre-processing scheme for an LDPC decoder. The system includes a receiver configured to detect transmission of a first data packet and receive a first set of data bits corresponding to a first portion of the first data packet. The system further includes a histogram generator configured to calculate log-likelihood ratios for each data bit from the first set of data bits, and generate a histogram based on the calculated log-likelihood ratios. The receiver is configured to continue receiving a second set of data bits corresponding to a second portion of the first data packet. The system further includes a selector configured to activate or inactivate a log-likelihood ratio pre-processing scheme on the received second set of data bits based on characteristics of the histogram.

20 Claims, 5 Drawing Sheets

(51) Int. Cl.
 *H03M 13/11* (2006.01)
 *H03M 13/37* (2006.01)
 *H03M 13/00* (2006.01)

(52) U.S. Cl.
 CPC ... *H03M 13/3707* (2013.01); *H03M 13/3723* (2013.01); *H03M 13/612* (2013.01); *H03M 13/6325* (2013.01); *H03M 13/658* (2013.01); *H03M 13/6594* (2013.01); *H04L 1/0051* (2013.01); *H04L 1/0058* (2013.01); *H04L 1/0061* (2013.01)

(58) Field of Classification Search
 CPC .......... H03M 13/1111; H03M 13/3707; H03M 13/6325; H03M 13/658; H03M 13/6594; H03M 13/3723; H03M 13/612
 See application file for complete search history.

(56) References Cited

U.S. PATENT DOCUMENTS

| | | |
|---|---|---|
| 9,461,671 B1 | 10/2016 | Chang et al. |
| 2004/0128592 A1 | 7/2004 | Park |
| 2016/0092301 A1 | 3/2016 | Ish-Shalom et al. |
| 2016/0226528 A1* | 8/2016 | Serbetli ............. H03M 13/6502 |

* cited by examiner

SYSTEMS AND METHODS FOR A LOG-LIKELIHOOD RATIO BASED DYNAMIC PRE-PROCESSING SELECTION SCHEME IN A LOW-DENSITY PARITY-CHECK DECODER

CROSS-REFERENCE TO RELATED APPLICATION

This disclosure claims the benefit under 35 U.S.C. § 119(e) of U.S. Provisional Patent Application No. 62/408,408, filed Oct. 14, 2016, which is hereby incorporated by reference herein in its entirety.

FIELD OF USE

This disclosure relates to decoder resource management in a low-density parity-check (LDPC) decoder, and specifically, to a log-likelihood ratio (LLR) based dynamic pre-processing selection scheme in an LDPC decoder.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

In existing communication systems, fixed-point LDPC coding has been widely used. The LDPC code includes a linear error correcting code that encodes and transmits a set of data bits over a noisy transmission channel. An LDPC decoder is usually employed at the receiver to decode received data bits, which implements an iterative decoding scheme based on the log-likelihood ratio (LLR) of decoding variable nodes of a code block. However, the LLR values sometimes can be heavily affected by channel conditions. For example, on a fading channel with no channel state information at the receiver, the bit error rate (BER) performance using the LDPC decoder based on LLR values is usually dissatisfactory.

SUMMARY

Embodiments described herein provide a method for dynamically selecting a pre-processing scheme for a low-density parity-check (LDPC) decoder. Transmission of a first data packet is detected at a receiver. A first set of data bits corresponding to a first portion of the first data packet are received. Log-likelihood ratios for each data bit from the first set of data bits are calculated. A histogram based on the calculated log-likelihood ratios is generated. A second set of data bits corresponding to a second portion of the first data packet is continued to be received. A log-likelihood ratio pre-processing scheme is activated or inactivated on the received second set of data bits based on characteristics of the histogram.

In some embodiments, when the log-likelihood ratio pre-processing scheme is activated or inactivated on the received second set of data bits based on characteristics of the histogram, a first pre-defined characteristic requirement corresponding to a first bin on the histogram is identified. It is then determined whether a first count of log-likelihood ratios that belongs to the first bin meets the first pre-defined characteristic requirement. A first output bit is generated based on the determining whether the first count of log-likelihood ratios that belongs to the first bin meets the first pre-defined characteristic requirement.

In some embodiments, a second pre-defined characteristic requirement corresponding to a second bin on the histogram is identified. It is determined whether a second count of log-likelihood ratios that belongs to the second bin meets the second pre-defined characteristic requirement. A second output bit is generated based on the determining whether the second count of log-likelihood ratios that belongs to the second bin meets the second pre-defined characteristic requirement.

In some embodiments, the log-likelihood ratio pre-processing scheme is activated on the received second set of data bits when both the first output bit and the second output bit equal one. The log-likelihood ratio pre-processing scheme is deactivated on the received second set of data bits when one of the first output bit and the second output bit equals zero.

In some embodiments, the first pre-defined characteristic requirement and the second pre-defined characteristic requirement are configured based on channel characteristics indicative of a line of sight channel.

In some embodiments, a third count of log-likelihood ratios that belongs to a third bin on the histogram is generated. A third output bit of one corresponding to the third bin is generated when no characteristic requirement is pre-defined for the third count. The third output bit is sent to be combined with the first output bit and the second output bit at an AND gate.

In some embodiments, for each data bit, a first probability that the data bit equals zero is calculated. A second probability that the data bit equals one is calculated. A logarithm of a ratio between the first probability and the second probability is calculated.

In some embodiments, when the histogram based on the calculated log-likelihood ratios is generated, a plurality of bins are determined for the calculated log-likelihood ratios. For each calculated log-likelihood ratio, the calculated log-likelihood ratio against a first range of a first bin from the plurality of bins are compared, via a first comparator. A first output bit is generated based on the comparison. A first count is then increased by one when the first output bit equals one.

In some embodiments, for each calculated log-likelihood ratio, the first output bit is negated. The negated first output bit is fed to a second comparator as a control signal. When the negated first output bit equals one, the calculated log-likelihood ratio is compared, via the second comparator, against a second range of a second bin from the plurality of bins. A second output bit is generated based on the comparison. A second count is increased by one when the second output bit equals one.

In some embodiments, transmission of a second data packet is detected, at the receiver. Log-likelihood ratios are re-calculated for data bits from the second data packet. The histogram is re-generated based on the re-calculated log-likelihood ratios. The log-likelihood ratio pre-processing scheme is activated or deactivated based on incoming data bits based on characteristics of the re-generated histogram when the second data packet is being transmitted.

Embodiments described herein provide a system for dynamically selecting a pre-processing scheme for an LDPC decoder. The system includes a receiver configured to detect transmission of a first data packet and receive a first set of data bits corresponding to a first portion of the first data packet. The system further includes a histogram generator configured to calculate log-likelihood ratios for each data bit from the first set of data bits, and generate a histogram based on the calculated log-likelihood ratios. The receiver is configured to continue receiving a second set of data bits corresponding to a second portion of the first data packet. The system further includes a selector configured to activate or inactivate a log-likelihood ratio pre-processing scheme on the received second set of data bits based on characteristics of the histogram.

In some embodiments, the selector further includes a first condition block configured with a first pre-defined characteristic requirement corresponding to a first bin on the histogram. The first condition block is configured to determine whether a first count of log-likelihood ratios that belongs to the first bin meets the first pre-defined characteristic requirement, and generate a first output bit based on the determining of whether the first count of log-likelihood ratios that belongs to the first bin meets the first pre-defined characteristic requirement.

In some embodiments, the selector further includes a second condition block configured with a second pre-defined characteristic requirement corresponding to a second bin on the histogram. The second condition block is configured to determine whether a second count of log-likelihood ratios that belongs to the second bin meets the second pre-defined characteristic requirement, and generate a second output bit based on the determining of whether the second count of log-likelihood ratios that belongs to the second bin meets the second pre-defined characteristic requirement.

In some embodiments, the selector further includes an AND gate coupled to the first condition block and the second condition block. The AND gate is configured to generate a selection bit to activate the log-likelihood ratio pre-processing scheme on the received second set of data bits when both the first output bit and the second output bit equal one. Or The AND gate is configured to generate a selection bit to deactivate the log-likelihood ratio pre-processing scheme on the received second set of data bits when one of the first output bit and the second output bit equals zero.

In some embodiments, the selector is further configured to configure the first condition block with the first pre-defined characteristic requirement and the second condition block with the second pre-defined characteristic requirement based on channel characteristics indicative of a line of sight channel.

In some embodiments, the selector further includes a third condition block coupled to the AND gate. The third condition block corresponds to a third count of log-likelihood ratios that belongs to a third bin on the histogram, and is configured to output a third output bit of one corresponding to the third bin when no characteristic requirement is pre-defined for the third count.

In some embodiments, the histogram generator is configured to, for each data bit, calculate a first probability that the data bit equals zero, and a second probability that the data bit equals one. The histogram generator is then configured to calculate a logarithm of a ratio between the first probability and the second probability.

In some embodiments, the histogram generator is configured to determine a plurality of bins for the calculated log-likelihood ratios. The histogram generator further includes a first comparator configured to compare each calculated log-likelihood ratio against a first range of a first bin from the plurality of bins, and generate a first output bit based on the comparison. The histogram generator further includes a first counter coupled to the first comparator. The first counter is configured to increase a first count by one when the first output bit equals one.

In some embodiments, the selector further includes a NOT gate coupled to the first comparator and configured to negate the first output bit. The selector further includes a second comparator coupled to the NOT gate. The second comparator is configured to receive the negated first output bit as a control signal. When the negated first output bit equals one, the second comparator is configured to compare the calculated log-likelihood ratio against a second range of a second bin from the plurality of bins, and generate a second output bit based on the comparison. The selector further includes a second counter coupled to the second comparator. The second counter is configured to increase a second count by one when the second output bit equals one.

In some embodiments, the receiver is configured to detect transmission of a second data packet. The histogram generator is configured to re-calculate log-likelihood ratios for data bits from the second data packet and re-generate the histogram based on the re-calculated log-likelihood ratios. The selector is configured to activate or inactivates the log-likelihood ratio pre-processing scheme on incoming data bits based on characteristics of the re-generated histogram when the second data packet is being transmitted.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

Figure 1:
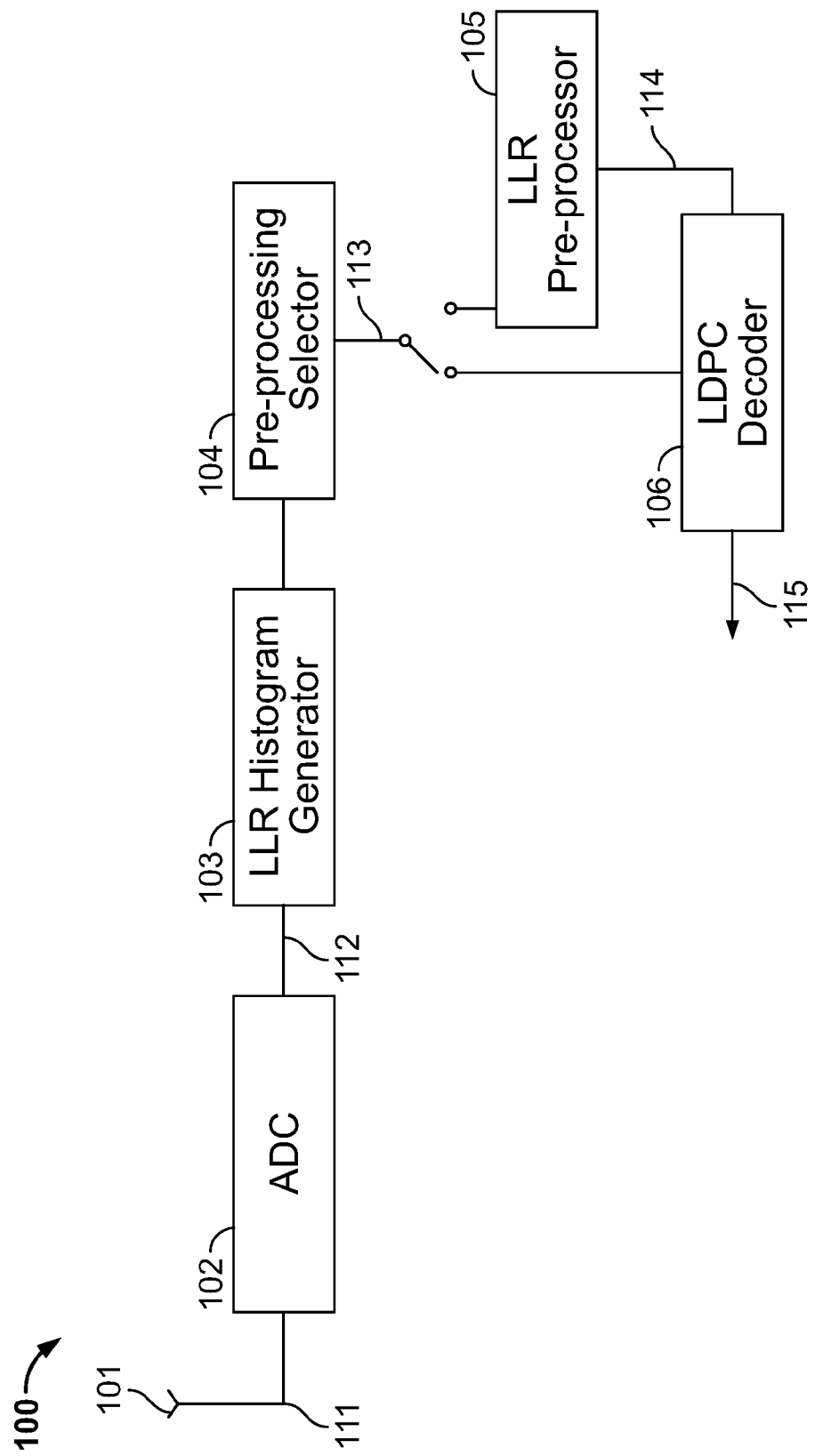
FIG. 1 is a block diagram illustrating an example circuit structure of a wireless receiver employing an LLR-based pre-processing selector, according to some embodiments described herein.

This disclosure describes methods and systems for dynamically selecting an LLR preprocessing scheme in LDPC decoders.

An LDPC decoder (or any other binary combinatory decoder) is configured to decode a code block based on an iterative process. For example, a fixed-point LDPC decoder at a receiver is configured to process a received code block into block columns, known as check nodes and variable nodes. At each iteration, bits of each check node or variable node are updated (e.g., flipped from 0 to 1, or vice versa) based on the LLRs of data bits from other variable nodes or check nodes, and based on a parity bit (e.g., a sum that is usually calculated among the block columns). As the LDPC decoder generally cannot engage in an infinite number of iterations, the actual number of iterations limits the accuracy of the LDPC decoder. When a significant number of iterations are implemented by the LDPC decoder, decoding accuracy may be improved, but at the cost of higher consumption of decoding resources, e.g., hardware and memory.

On the other hand, as the channel input to the LDPC decoder, e.g., the received signal from the channel, is usually quantized into a number of data bits, the number of data bits affects consumption of decoding resources as well, e.g., the more data bits are used, the more decoding resources is to be consumed at each iteration. For example, in a wireless local area network (WLAN) where a noisy channel is expected, the LLR values of decoding variables can be as high as requiring a number of 15-20 bits. Thus, an iterative decoding process that involves a desired number of iterations to guarantee decoding accuracy may end up consuming significant decoding resources at the LDPC decoder when each iteration needs to update a number of 15-20 bits. LLR pre-processing, which involves linear or non-linear scaling of the LLR values of decoding variables before passing the decoding variables to an LDPC decoder, is sometimes implemented to compress the high LLR values to smaller values, and hence less bits per iteration need to be updated, or alternatively scale low LLR values to higher LLR values to improve decoding accuracy.

LLR pre-processing, however, can sometimes degrade the LDPC decoding performance for certain modulation and coding schemes (MCS) and channel types. For example, under a high MCS (e.g., 1024 QAM), LLR pre-processing improves decoding performance for line of sight (LOS) channels (e.g., a wireless channel where electromagnetic signals travel in a direct path from the transmitter to the receiver), but degrades decoding performance for non-line of sight (NLOS) and scattered channels (e.g., when signal transmission is partially obstructed along the path). To achieve better decoding performance, the channel type needs to be dynamically identified when each packet is received, so that the receiver determines whether to turn on or off LLR pre-processing. However, channel classification per each received packet is difficult and impractical.

Embodiments described herein provide a dynamic pre-processing selection scheme based on LLR statistics, which captures channel characteristics using a histogram of LLRs. The LDPC decoder is then configured to use the LLR statistics to determine whether LLR pre-processing is to be implemented before decoding the received data bits. In this way, the LLR pre-processing is launched only when LLR statistics indicates that the channel is most likely of a particular type that is suitable for LLR pre-processing, e.g., a LOS channel. The LLR statistics is constantly and dynamically monitored and updated based on received data bits, and LLR pre-processing is then dynamically activated or inactivated based on a set of pre-defined rules that require the LLR statistics to satisfy particular requirements indicative of channel characteristics of the particular type of channel. The LLR pre-processing is thus more efficient in resource consumption and the overall decoding performance is improved.

FIG. 1 is a block diagram illustrating an example circuit structure of a wireless receiver 100 employing an LLR-based pre-processing selector, according to some embodiments described herein. The wireless receiver 100 is configured to be operated under a variety of wireless protocols, such as 802.11 standards, and/or the like. The wireless receiver 100 includes one or more receiving antennas 101, which are configured to receive a wireless signal 111 from the transmission channel. An analog-to-digital converter (ADC) 102 is communicatively coupled to the receiving antennas 101, and is configured to convert the received signal 111 to digital data samples, e.g., a number of data bits 112.

An LLR histogram generator 103 is communicatively coupled to the ADC 102. The LLR histogram generator 103 is configured to receive the data bits 112 from the ADC 102, and calculate a number of LLR values for each data bit. The LLR histogram generator 103 is then configured to generate a histogram of the calculated LLR values. Further details of the LLR histogram generation at 103 is discussed in relation to FIG. 3.

A pre-processing selector 104 is communicatively coupled to the LLR histogram generator 103, and is configured to select whether the calculated LLR values of data bits 112 need to be pre-processed, at the LLR pre-processor 105. For example, the pre-processing selector 104 is communicatively coupled to a switch that is configured to connect to one of the LLR pre-processor 105 and the LDPC decoder 106. Further detail of the pre-processing selector 104 is described in relation to FIGS. 4-5.

When the pre-processing selector 104 is connected to the LLR pre-processor 105, the LLR values 113 of data bits 112 are pre-processed at LLR pre-processor 105, e.g., by scaling higher LLR values to smaller values to reduce number of iterations at the decoder, or scaling lower LLR values to higher LLR values to improve decoder performance. The output of the LLR pre-processor 105, i.e., scaled LLR values 114, is then sent to the LDPC decoder.

When the pre-processing selector 104 is connected to the LDPC decoder 106, the LLR values 113 of data bits 112 are sent to the LDPC decoder 106 directly without pre-processing.

The LDPC decoder 106 is configured to receive LLR values, e.g., the original LLR values 113 or the scaled LLR values 114, based on which the LDPC decoder 106 is configured to decode and generate decoded data bits 115.

Figure 2:
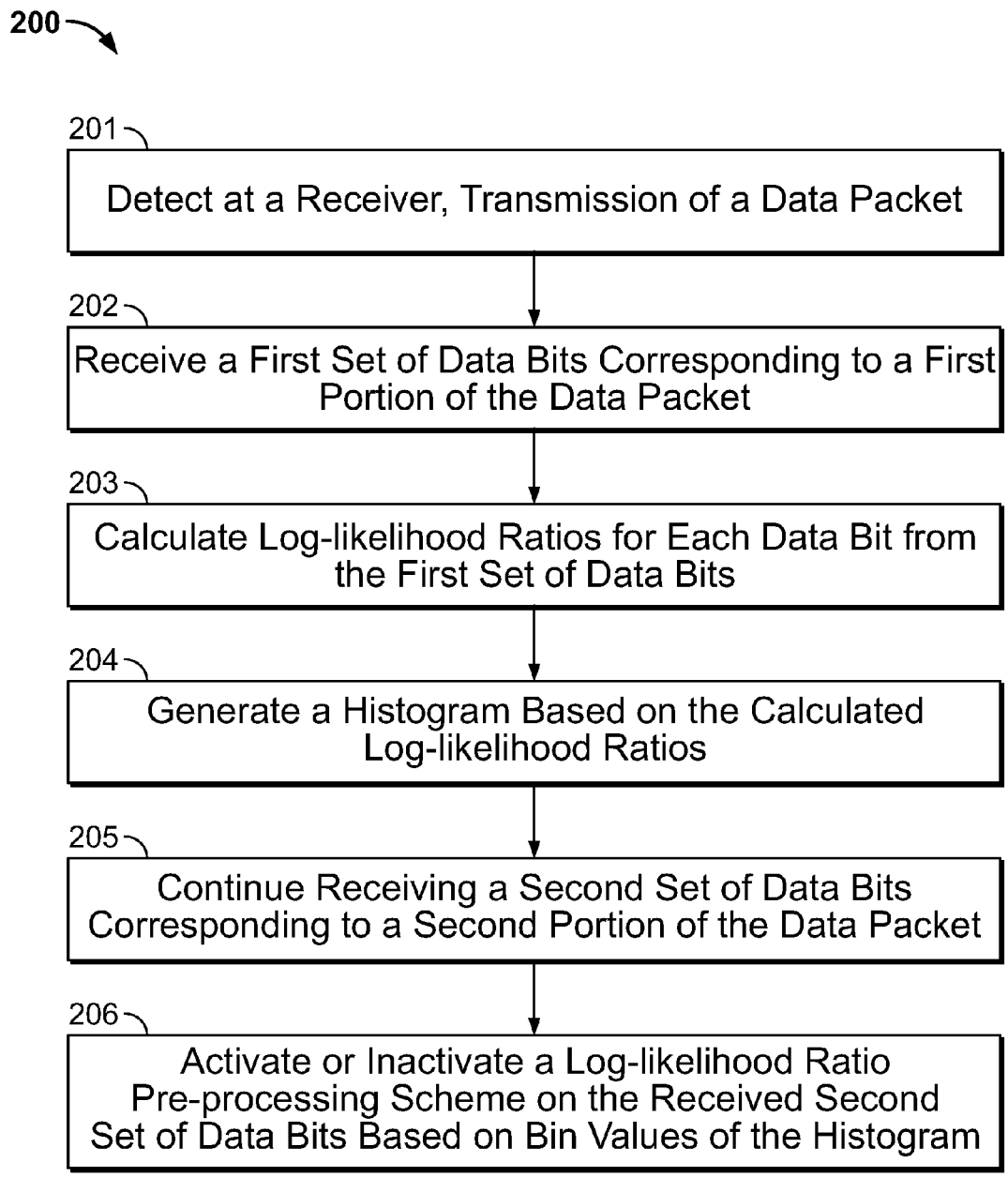
FIG. 2 is a logic flow diagram illustrating an example process of dynamically selecting an LLR pre-processing scheme based on the LLR values of received data bits, which is implemented via the circuit structure illustrated in FIG. 1, according to some embodiments described herein.

FIG. 2 is a logic flow diagram illustrating an example process 200 of dynamically selecting an LLR pre-processing scheme based on the LLR values of received data bits, which is implemented via the circuit structure illustrated in FIG. 1, according to some embodiments described herein. At 201, transmission of a data packet is detected at a receiver, e.g., at the wireless receiver 100 in FIG. 1. At 202, a first set of data bits corresponding to a first portion of the data packet is received. For example, the wireless receiver (e.g., 100 in FIG. 1) is configured to process LLR values of received data bits while the data packet is being received, e.g., during the transmission of the preamble of the data packet or the first few bits of data, and is configured to generate an LLR histogram.

At 203, an LLR for each data bit from the first set of data bits is calculated, e.g., at the LLR histogram generator 103 in FIG. 1. For example, for each received data bit (e.g., data bits 112 in FIG. 1), the LLR is calculated as:

$$LLR = \log\left(\frac{\text{Probability of the data bit being equal to 0}}{\text{Probability of the data bit being equal to 1}}\right)$$

A positive LLR indicates a greater probability of the data bit being equal to 0, and a negative LLR indicates a greater probability of the data bit being equal to one. The magnitude of the LLR provides a reliability of the estimation, e.g., |LLR|=0 indicates the estimation is unreliable as the data bit has an equal chance of being zero or one; and |LLR| being a higher value indicates that the data bit value being zero or one is more reliable.

Figure 3:
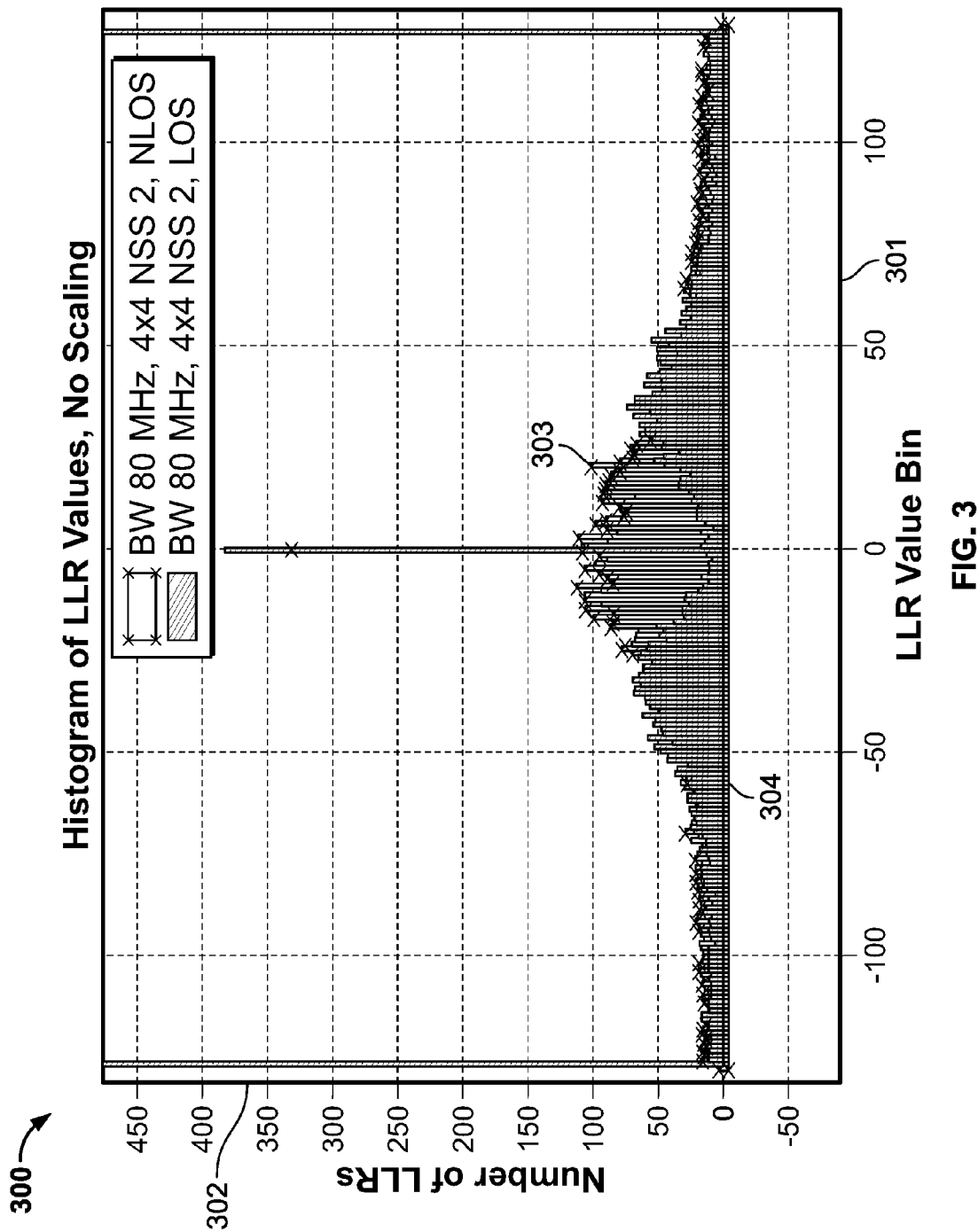
FIG. 3 is an example data plot diagram illustrating an example LLR histogram of received data bits, which is generated at the LLR histogram generator in FIG. 1, according to some embodiments described herein.

At 204, an LLR histogram is generated based on the calculated LLR values are generated at 204, e.g., at the LLR histogram generator 103 in FIG. 1. For example, as shown in FIG. 3, LLR values are grouped into value bins that are linearly (or logarithmically) spaced, e.g., spaced at 8, 16, etc. The number of LLRs that falls into each bin is then counted, e.g., a LLR value of 5 falls into the bin of [0,8), and a LLR value of 8 falls into the bin of [8, 16), etc. An LLR histogram is generated to show the count of LLR values within each value bin, as shown in FIG. 3.

At 205, the wireless receiver (e.g., 100 in FIG. 1) is configured to continue receive a second set of data bits corresponding to a second portion of the data packet, e.g., the payload data bits of the data packet being transmitted. At 206, an LLR pre-processing scheme (e.g., the LLR pre-processor 105 in FIG. 1) is activated or deactivated for the received second set of data bits based on bin values of the histogram, as further discussed in relation to FIGS. 4-5. In some embodiments, when the LLR pre-processing scheme is activated at 206, both the first set of data bits and the second set data bits may be pre-processed. In this case, the calculated LLR values corresponding to the first set of data bits, which is calculated at 203, are stored at a memory unit, and are passed to the LLR pre-processing unit before being sent to the LDPC decoder.

Process 200 (including 201-205) is configured to repeat for each received data packet, or every few data packets. In this way, the LLR histogram is constantly updated and the LLR pre-processing is activated or deactivated based on the LLR statistics for each instant packet that is being transmitted.

FIG. 3 is an example data plot diagram illustrating an example LLR histogram of received data bits, which is generated at the LLR histogram generator in FIG. 1, according to some embodiments described herein. The horizontal axis 301 of diagram 300 represents the LLR value bins. For example, if the bin values are linearly spaced by eight, the value bins include: . . . [−16, −8), [−8,0), [0,8), [8, 16) . . . . The vertical axis 302 represents the count of LLR values (each corresponding to a received data bit) that falls within each corresponding LLR value bin on the horizontal axis 301.

In diagram 300, histograms 303-304 are shown for data bits received at the same bandwidth (e.g., 80 MHz), the same number of spatial strings (NSS) (e.g., a 4×4 multiple-input multiple-output channel), but different types of channels. Histogram 303 is generated based on data bits received on a LOS channel, and histogram 304 is generated based on data bits received on an NLOS channel. As shown at 303, a large count of LLR values concentrate at an LLR value bin of zero, indicating the reliability of detecting whether the corresponding data bit is zero or one is rather low on the LOS channel. The pre-processing selector (e.g., see 104 in FIG. 1) is configured to analyze the characteristics of the LLR histogram to identify an LOS channel such that LLR pre-processing is to be implemented, as further discussed in relation to FIGS. 4-5.

Figure 4:
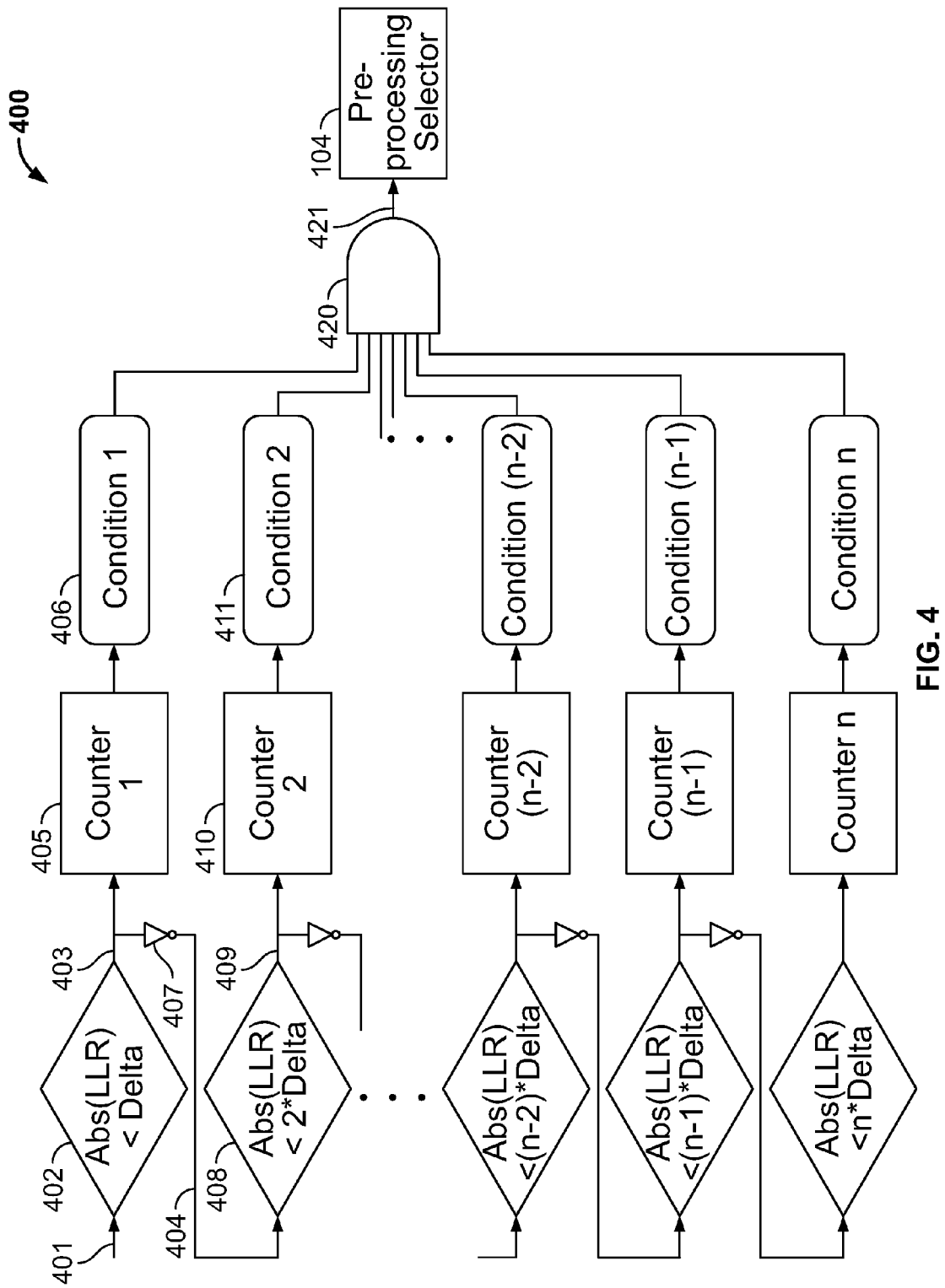
FIGS. 4-5 are block diagrams, each illustrating an example circuit of the LLR pre-processing selector in FIG. 1, according to some embodiments described herein.
Figure 5:
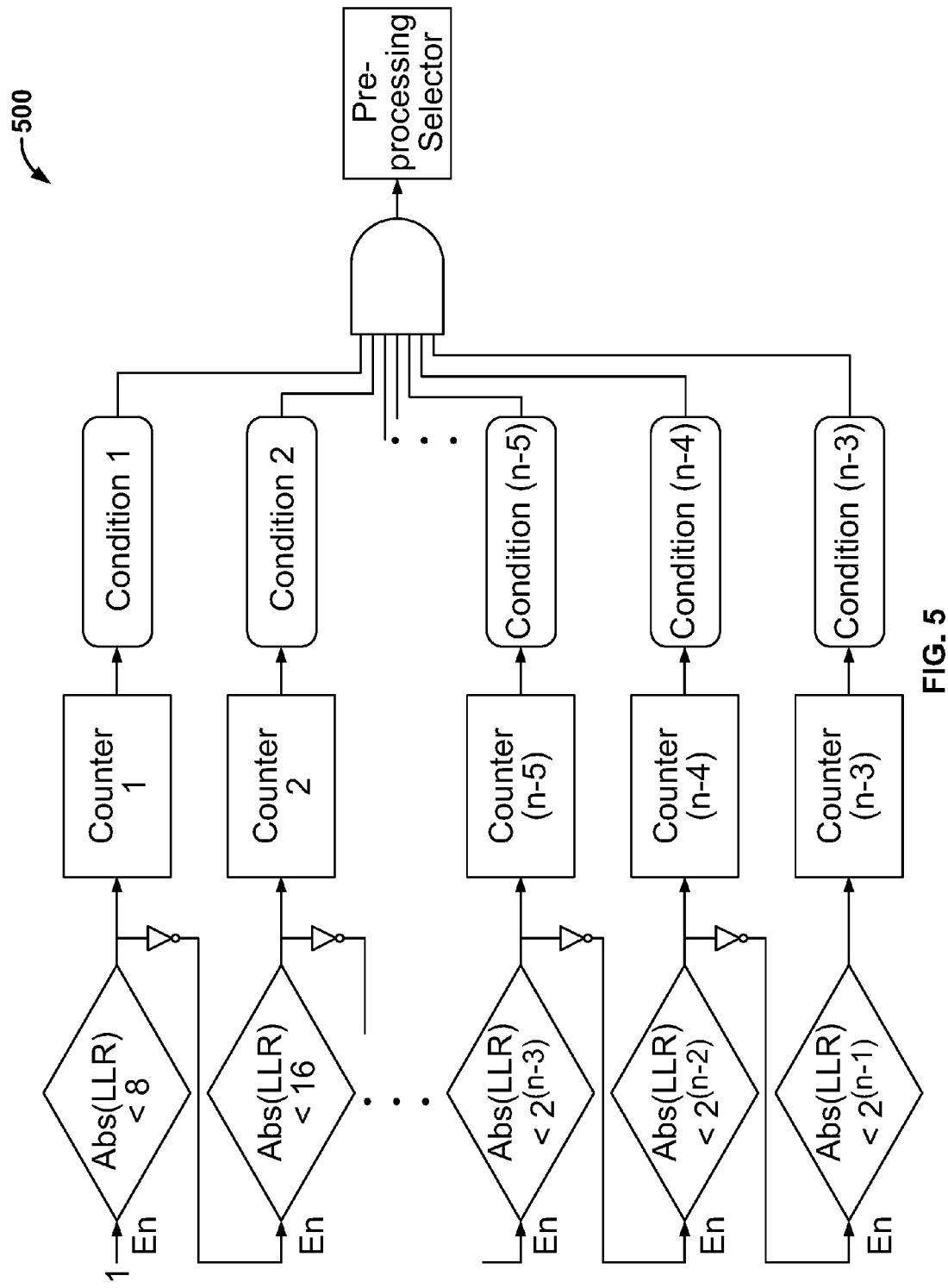

FIGS. 4-5 are block diagrams, each illustrating an example circuit of the LLR pre-processing selector in FIG. 1, according to some embodiments described herein. In FIG. 4, linearly spaced histogram bin values are used, for example, delta as shown at 402 represents a bin value range. Circuit 400 (similar to part of the LLR histogram generator 103 in FIG. 1) includes a number of parallel comparators (e.g., 402, 408, etc.) and counters (e.g., 405, 410, etc.), and each set of a comparator and a counter is configured to determine whether an input LLR value 401 belongs to a particular LLR value bin. Specifically, circuit 400 is configured to receive an input of a calculated LLR value 401 corresponding to a received data bit, which is calculated, e.g., at the LLR histogram generator 103 in FIG. 1. The LLR value 401 is passed onto a comparator 402, which is configured to compare the magnitude (e.g., absolute value) of the LLR value 401 against a first bin value delta, e.g., whether the LLR value 401 is within the bin [0, delta). The comparator 402 is configured to generate an output bit 403 of one when |LLR|<delta (i.e., within the bin of [0, delta)), or an output bit 403 of zero when |LLR|>delta (i.e., outside the bin of [0, delta)). Thus, when the output bit 403 equals one, the counter 405 that is coupled to the comparator 402 is configured to add one to the current counting value. In this way, when a number of LLR values is serially transmitted to circuit 400, the counter 405 records the count of LLR values that belong to the bin [0, delta).

The output bit 403 from comparator is also passed through a NOT gate 407, and the negated bit 404 is fed to a second comparator 408 as a control signal. Thus, when the output bit 403 equals one, indicating the magnitude of LLR value 401 is within the bin [0, delta), the negated bit 404 equals zero, which does not trigger further processing at the comparator 408 and any other comparators that are further coupled in circuit 400. When the output bit 403 equals zero, indicating the magnitude of LLR value 401 is outside the bin [0, delta), the negated bit 404 equals one, which triggers the comparator 408 to compare the magnitude of LLR value 401 against a second bin value range, e.g., whether the magnitude of LLR value 401 is within the bin [delta, 2·delta). Similar to output bit 403, the output bit 409 from the comparator 408 indicates whether the magnitude of LLR value 401 is within the bin [delta, 2·delta) such that the counter 410 is configured to count the number of LLR values that belong to the bin [delta, 2·delta). The output bit 409 is then coupled to another NOT gate to serve as the control signal to the comparator for the next bin, and a number N (e.g., 100, 200, 300, etc.) of comparators and counters are configured to be connected in a similar manner as described above with respect to comparators 402 and 408. In this way, circuit 400 is configured to count the number of LLR values that belong to each consecutive bin.

Within circuit 400, each counter is coupled to a condition block, which is configured to specify a pre-defined rule to be applied to the number of LLR values from the respective counter. For example, when there is a large number of LLR values close to zero, exhibiting characteristics of an LOS channel (e.g., see histogram 304 in FIG. 3), the output of counter 405 is likely to be used for determining whether LLR pre-processing is to be selected. Condition block 406 is in turn configured to determine whether the output of counter 405 is greater than a threshold value. If the output of counter 405 is greater than the threshold value, the condition block 406 is configured to generate an output bit of one to the AND gate 420. Otherwise, if the output of counter 405 is not greater than the threshold value, the condition block 406 is configured to generate an output bit of 0 to the AND gate 420.

In some embodiments, the condition blocks 406, 411, etc. in circuit 400 are configured to be dynamically adjusted, enabled or disabled. For example, the threshold value employed by each condition block can be dynamically adjusted based on bit error rate (BER) performance of previously received data packets. One or more condition blocks may be disabled, e.g., when the number of LLR values in the respective bins are not material to determine channel characteristics. A condition block is configured to output a constant bit of one to the AND gate 420, when the condition block is not in use.

The AND gate 420 is configured to receive all output bits from all parallel condition blocks, and generate an output bit 421 of one only when all condition blocks output a bit of one. When the output bit 421 equals one, the pre-processing selector 104 is configured to connect to the LLR pre-processor 105 in FIG. 1. Otherwise, when the output bit 421 equals zero, the pre-processing selector 104 is configured to connect to the LDPC decoder 106 in FIG. 1.

For example, when delta=16, circuit 400 is configured to count LLR values within a number of linearly spaced bins (for an n-bit LDPC with one bit representing the sign of the LLR value): [0, 16), [16, 32), [32, 48), . . . and $[2^{n-1}-16, 2^{n-1})$. Condition block corresponding to bin [0:16) is configured to output a bit of one if the histogram of bin [0:16) is less than 400. Condition block corresponding to bin [80:96) is configured to output a bit of one if the histogram of bin [80:96) is greater than 800. All other condition blocks are configured to output a constant bit of one.

In FIG. 5, circuit 500 is operated in a similar manner as circuit 400 in FIG. 4, for logarithmically spaced bins such as $[0, 2^3), [2^3, 2^4), \ldots [2^{n-2}, 2^n)$. In this case, for an n-bit LDPC having a codeword length of $2^n$, the logarithmically spaced bins are used: $[0, 2), [2, 2^2), [2^3, 2^4), \ldots [2^{n-2}, 2^{n-1})$. Condition block corresponding to the bin $[2^2, 2^3)$ is configured to output a bit of one if the histogram of bin $[2^2, 2^3)$ is greater than 300. All other condition blocks are configured to output a constant bit of one.

Various embodiments discussed in conjunction with FIGS. 1-5 are performed by various electronic components of one or more electronic circuits, such as but not limited to an integrated circuit, and/or the like. Various components discussed throughout this disclosure such as, but not limited to a wireless receiver (e.g., 100 in FIG. 1), an LLR histogram generator (e.g., 103 in FIG. 1), a pre-processing selector (e.g., 104 in FIG. 1), an LLR pre-processor (e.g., 105 in FIG. 1), an LDPC decoder (e.g., 106 in FIG. 1), comparators (e.g., 402, 408, etc. in FIG. 4), counters (e.g., 405, 410, etc. in FIG. 4), condition blocks (e.g., 406, 411, etc. in FIG. 4), an AND gate (e.g., 420 in FIG. 4), and/or the like, are configured to include a set of electronic circuit components, and communicatively operate on one or more electronic circuits. Each electronic circuit is configured to include any of, but not limited to logic gates, memory cells, amplifiers, filters, and/or the like. Various embodiments and components disclosed herein are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 10 does not necessarily require the particular order shown, or sequential order, to achieve desirable results. In certain implementations, multitasking and parallel processing may be advantageous. Other variations are within the scope of the following claims.

What is claimed is:

1. A method for dynamically selecting a pre-processing scheme for a low-density parity-check (LDPC) decoder, the method comprising:
   detecting, at a receiver, transmission of a first data packet;
   receiving a first set of data bits corresponding to a first portion of the first data packet;
   calculating log-likelihood ratios for each data bit from the first set of data bits;
   generating a histogram based on the calculated log-likelihood ratios;
   continuing receiving a second set of data bits corresponding to a second portion of the first data packet; and
   activating or inactivating a log-likelihood ratio pre-processing scheme on the received second set of data bits based on characteristics of the histogram.

2. The method of claim 1, wherein the activating or inactivating a log-likelihood ratio pre-processing scheme on the received second set of data bits based on bin values of the histogram comprises:
   identifying a first pre-defined characteristic requirement corresponding to a first bin on the histogram;
   determining whether a first count of log-likelihood ratios that belongs to the first bin meets the first pre-defined characteristic requirement; and
   generating a first output bit based on the determining whether the first count of log-likelihood ratios that belongs to the first bin meets the first pre-defined characteristic requirement.

3. The method of claim 2, further comprising:
   identifying a second pre-defined characteristic requirement corresponding to a second bin on the histogram;
   determining whether a second count of log-likelihood ratios that belongs to the second bin meets the second pre-defined characteristic requirement; and
   generating a second output bit based on the determining whether the second count of log-likelihood ratios that belongs to the second bin meets the second pre-defined characteristic requirement.

4. The method of claim 3, further comprising:
   activating the log-likelihood ratio pre-processing scheme on the received second set of data bits when both the first output bit and the second output bit equal one; and
   deactivating the log-likelihood ratio pre-processing scheme on the received second set of data bits when one of the first output bit and the second output bit equals zero.

5. The method of claim 4, further comprising:
   configuring the first pre-defined characteristic requirement and the second pre-defined characteristic requirement based on channel characteristics indicative of a line of sight channel.

6. The method of claim 4, further comprising:
identifying a third count of log-likelihood ratios that belongs to a third bin on the histogram;
configuring a third output bit of one corresponding to the third bin when no characteristic requirement is pre-defined for the third count; and
sending the third output bit to be combined with the first output bit and the second output bit at an AND gate.

7. The method of claim 1, wherein the calculating log-likelihood ratios for each data bit from the first set of data bits comprises:
for each data bit:
calculating a first probability that the data bit equals zero;
calculating a second probability that the data bit equals one; and
calculating a logarithm of a ratio between the first probability and the second probability.

8. The method of claim 1, wherein the generating a histogram based on the calculated log-likelihood ratios comprises:
determining a plurality of bins for the calculated log-likelihood ratios; and
for each calculated log-likelihood ratio:
comparing, via a first comparator, the calculated log-likelihood ratio against a first range of a first bin from the plurality of bins;
generating a first output bit based on the comparison; and
increasing a first count by one when the first output bit equals one.

9. The method of claim 7, further comprising:
for each calculated log-likelihood ratio:
negating the first output bit;
feeding the negated first output bit to a second comparator as a control signal;
when the negated first output bit equals one, comparing, via the second comparator, the calculated log-likelihood ratio against a second range of a second bin from the plurality of bins;
generating a second output bit based on the comparison; and
increasing a second count by one when the second output bit equals one.

10. The method of claim 8, further comprising:
detecting, at the receiver, transmission of a second data packet;
re-calculating log-likelihood ratios for data bits from the second data packet;
re-generating the histogram based on the re-calculated log-likelihood ratios; and
activating or inactivating the log-likelihood ratio pre-processing scheme on incoming data bits based on characteristics of the re-generated histogram when the second data packet is being transmitted.

11. A system for dynamically selecting a pre-processing scheme for a low-density parity-check (LDPC) decoder, the system comprising:
a receiver configured to detect transmission of a first data packet and receive a first set of data bits corresponding to a first portion of the first data packet;
a histogram generator configured to calculate log-likelihood ratios for each data bit from the first set of data bits, and generate a histogram based on the calculated log-likelihood ratios;
the receiver being configured to continue receiving a second set of data bits corresponding to a second portion of the first data packet; and
a selector configured to activate or inactivate a log-likelihood ratio pre-processing scheme on the received second set of data bits based on characteristics of the histogram.

12. The system of claim 11, wherein the selector further comprises:
a first condition block configured with a first pre-defined characteristic requirement corresponding to a first bin on the histogram,
wherein the first condition block is configured to determine whether a first count of log-likelihood ratios that belongs to the first bin meets the first pre-defined characteristic requirement, and generate a first output bit based on the determining of whether the first count of log-likelihood ratios that belongs to the first bin meets the first pre-defined characteristic requirement.

13. The system of claim 12, wherein the selector further comprises:
a second condition block configured with a second pre-defined characteristic requirement corresponding to a second bin on the histogram;
wherein the second condition block is configured to determine whether a second count of log-likelihood ratios that belongs to the second bin meets the second pre-defined characteristic requirement, and generate a second output bit based on the determining of whether the second count of log-likelihood ratios that belongs to the second bin meets the second pre-defined characteristic requirement.

14. The system of claim 13, wherein the selector further comprises:
an AND gate coupled to the first condition block and the second condition block,
wherein the AND gate is configured to generate a selection bit to activate the log-likelihood ratio pre-processing scheme on the received second set of data bits when both the first output bit and the second output bit equal one, or the selection bit to deactivate the log-likelihood ratio pre-processing scheme on the received second set of data bits when one of the first output bit and the second output bit equals zero.

15. The system of claim 14, wherein the selector is further configured to:
configure the first condition block with the first pre-defined characteristic requirement and the second condition block with the second pre-defined characteristic requirement based on channel characteristics indicative of a line of sight channel.

16. The system of claim 14, wherein the selector further comprises:
a third condition block coupled to the AND gate,
wherein the third condition block corresponds to a third count of log-likelihood ratios that belongs to a third bin on the histogram, and is configured to output a third output bit of one corresponding to the third bin when no characteristic requirement is pre-defined for the third count.

17. The system of claim 11, wherein the histogram generator is configured to:
for each data bit:
calculate a first probability that the data bit equals zero;
calculate a second probability that the data bit equals one; and calculate a logarithm of a ratio between the first probability and the second probability.

18. The system of claim 11, wherein the histogram generator is configured to:
   determine a plurality of bins for the calculated log-likelihood ratios, and
   wherein the histogram generator further comprises:
      a first comparator configured to compare each calculated log-likelihood ratio against a first range of a first bin from the plurality of bins, and generate a first output bit based on the comparison; and
      a first counter coupled to the first comparator, the first counter being configured to increase a first count by one when the first output bit equals one.

19. The system of claim 16, wherein the selector further comprises:
   a NOT gate coupled to the first comparator and configured to negate the first output bit;
   a second comparator coupled to the NOT gate and configured to:
      receive the negated first output bit as a control signal,
      when the negated first output bit equals one, compare the calculated log-likelihood ratio against a second range of a second bin from the plurality of bins, and generating a second output bit based on the comparison; and
   a second counter coupled to the second comparator, the second counter being configured to increase a second count by one when the second output bit equals one.

20. The system of claim 18, wherein the receiver is configured to detect transmission of a second data packet,
   wherein the histogram generator is configured to re-calculate log-likelihood ratios for data bits from the second data packet and re-generate the histogram based on the re-calculated log-likelihood ratios; and
   wherein the selector is configured to activate or inactivates the log-likelihood ratio pre-processing scheme on incoming data bits based on characteristics of the re-generated histogram when the second data packet is being transmitted.

* * * * *